United States Patent [19]

Shirataki

[11] Patent Number: 4,509,455
[45] Date of Patent: Apr. 9, 1985

[54] APPARATUS FOR APPLYING EMULSION ONTO SCREEN PRINTING PLATE

[75] Inventor: Kenji Shirataki, Tokyo, Japan

[73] Assignee: Tokai Shoji Co. Ltd., Tokyo, Japan

[21] Appl. No.: 624,060

[22] Filed: Jun. 25, 1984

[30] Foreign Application Priority Data

Aug. 27, 1983 [JP] Japan .................... 58-156776

[51] Int. Cl.³ .................... B05C 3/00; B05C 11/00
[52] U.S. Cl. .................... 118/696; 101/123; 118/412; 118/413
[58] Field of Search .............. 118/696, 407, 412, 413; 101/123

[56] References Cited

U.S. PATENT DOCUMENTS

4,363,289 12/1982 Gasser .................... 118/696

Primary Examiner—Evan K. Lawrence

[57] ABSTRACT

A method and an apparatus for applying an emulsion onto a screen printing plate are disclosed, in which two squeegees are arranged on either side of the screen, one squeegee of which is directed to the applying operation and the other squeegee is directed to the scraping and recovering operation. In accordance with the invention, a high quality screen printing plate may be obtained and very convenient operation and handling may be achieved.

6 Claims, 10 Drawing Figures

APPARATUS FOR APPLYING EMULSION ONTO SCREEN PRINTING PLATE

FIELD OF THE INVENTION

This invention relates to an apparatus for applying an emulsion onto a screen printing plate in which, upon applying the emulsion of a photo-sensitive material onto the plate screen to be used for the screen printing process, the whole face of the screen may be applied with a film of uniform thickness with its ink-applying side being thin while its printing side is thick.

BACKGROUND OF THE INVENTION

Heretofore, the emulsion has been applied by vertically slidable squeegees of a bucket type contacted at their front edges with the screen consisting of a screen material of silk, polyester, nylon or the like of a given mesh size and a frame surrounding the screen material. In this case, manual moving operation requires a particularly high skill for applying a film of a uniform thickness. In order to overcome the difficulty of the prior art, there have been proposed various types of mechanically moving squeegees, as disclosed in U.S. Pat. No. 4,363,289 (corres. to the Published European Patent Application No. 0026538). The U.S. patent relates to a method and an apparatus for applying an emulsion onto a screen printing, in which squeegees arranges at either side of the screen are advanced toward the screen face for contacting therewith, inclined for flowing the emulsion out of the squeegees at their front edges, and vertically moved relative to the screen. With this prior art, the emulsion flows down naturally from the squeegees, so that the emulsion may be scraped by the front edge of the squeegee upon its upward movement for providing a uniform film thickness, whereas upon its downward movement (necessary for thick application) the emulsion may flow into the underside of the squeegee and is applied in different quantities thereby to provide a much irregular thickness. Upon application with the emulsion on both sides of the screen from its lower section, a certain distance between the screen face and the front edges of the squeegees is needed for giving a relatively thick emulsion film, because the contacted squeegees may scrape off the applied emulsion. Thus, the screen with a larger thickness of the emulsion on its printing side can not be produced. Further, the squeegees on both sides of the screen are symmetrically moved synchronously with each other by a single cylinder, so that one of the squeegees must be replaced by a rod or roller for application only on a single side of the screen, requiring a troublesome replacement and resulting in a very difficult switchover of the application from both sides to the single side of the screen or vice versa through continuous and automatic operation. Under printing with the screen, application of the more thick emulsion on the printing side than on the ink-applying side is essential for obtaining a beautiful print, which is difficult to be achieved by the prior art as described hereinabove. Further, since an arm for supporting and inclining the squeegees is supported to a slide which is slidably guided in a rail in order to move the squeegee forward and backward and since a piston for inclining the squeegee is swingable during forward and backward movement of the slide, correct control of the piston for inclining the squeegee is difficult after the end of the forward movement of the slide and setting of the slide into the rail is troublesome, resulting in a construction with complicated and troublesome controlling means.

Thus, an object of the invention is to solve the above problems of the prior art and to provide an apparatus for applying a more uniform thickness of an emulsion over the entire surface of a screen with its ink-applying side being thin while its printing side is thick for producing a beautiful print, in which one of squeegees arranged on one side of the screen is used for applying the emulsion while the other is used for scraping and recovering the emulsion, in which each of the squeegees is movable independently and only the applying squeegee may be inclined, and in which the emulsion is applied only during upward movement of the applying squeegee while the uniform application of the emulsion through the screen mesh and its recovery may be effected.

SUMMARY OF THE INVENTION

In accordance with the invention, an apparatus is provided for applying an emulsion onto a screen printing plate, in which vertically movable squeegees are arranged on either side of the screen which in turn is supported vertically on a base, which apparatus is useful in a method comprising the successive steps of: contacting one of the squeegees with one side of the screen for applying the emulsion; contacting both of the squeegees with both sides of the screen, one of said squeegees applying the emulsion onto the screen while the other squeegee scrapes off and recovering the emulsion from the opposite side of the screen; applying the emulsion a sufficient number of times repeatedly so as to urge the emulsion through the screen from its applying side to its printing side.

The apparatus comprises a base consisting of a frame having walls at its opposite sides; a supporting mechanism having clamps for supporting the screen vertically; a lifting mechanism for lifting along the screen an applying squeegee and a scraping squeegee arranged on both sides of the screen; actuating mechanisms for the squeegees, one of said actuating mechanisms allowing the applying squeegee to move toward the screen, to be contacted at its leading edge with the screen and to be inclined upon its upward movement while the other actuating mechanism allows the scraping squeegee to be not contacted with the screen, or to move toward the screen and to be contacted at its leading edge with the screen but not to be inclined upon its upward movement, both of said squeegees being restored to their horizontal state and retreated to be spaced apart from the screen upon their downward movement; and a controlling mechanism for controlling the movement of each squeegee for allowing the applying squeegee to apply the emulsion and the scraping squeegee to scrape and recover the emulsion.

BRIEF DESCRIPTION OF THE DRAWINGS

Preferred embodiments of the invention will now be described in detail with reference to the accompanying drawings, in which.

PREFERRED EMBODIMENTS OF THE INVENTION

Figure 3:
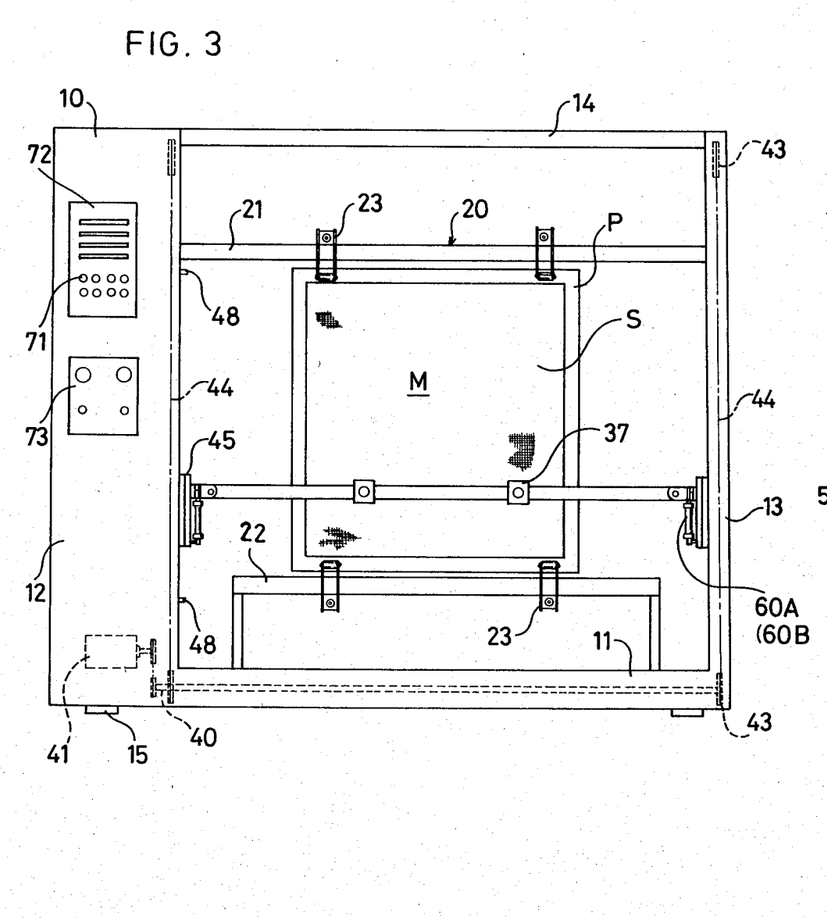
FIG. 3 is a front view of the apparatus according to the invention.
Figure 4:
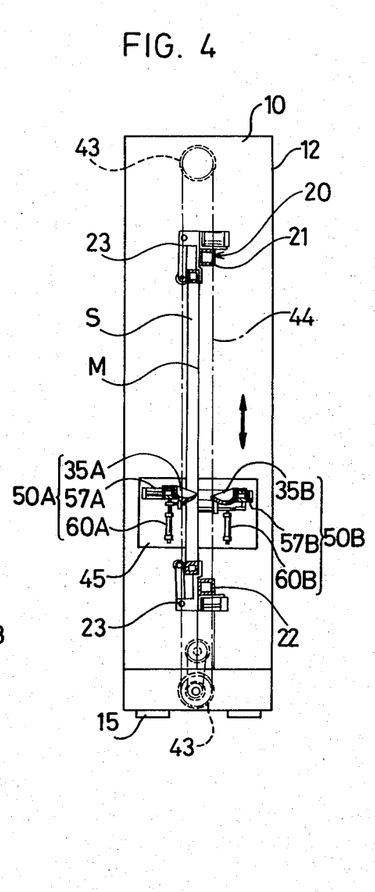
FIG. 4 is a vertical sectional view of the apparatus in FIG. 3.

Referring to FIG. 3, a frame 10 comprises a base 11 positioned horizontally by an adjuster 15, upright side walls 12, 13 arranged oppositely on the base 11, and an upper wall 14 between the side walls 12 and 13. The left wall 12 at its front is provided with an operational panel 72, 73 for previously setting various inputs of a controlling mechanism 70 and at its lower part is provided with a motor 41 as a driving source of a mechanism 40 for vertically moving squeegees.

Within an operational space between the side walls 12 and 13 is placed a screen printing plate S which consists essentially of a screen material M made of silk, polyester, nylon or the like of a given mesh size and a frame P surrounding the screen material S. Further, a supporting mechanism 20, a mechanism 40 and a squeegee actuating mechanism 50A, 50B are incorporated therein for applying an emulsion D of a liquid photo-sensitive material onto the screen S.

As shown in FIG. 3, the supporting mechanism 20 comprises bars 21, 22, for fixing clamp 23 supporting the screen S, which bars are arranged horizontally between the side walls 12, 13 and between upright stands on the base 11. In particular, the upper bar 21 is slidably adjustable for its vertical position and applicable to different sizes of the screen S. A suitable plurality of the clamps 23 fixed to the bars 21, 22 may be of any gripping type, such as a cylinder operation type, a screw fixing type and others, for gripping the frame P of the screen S so as to allow rapid and reliable attachment and removal of the screen S.

During such supported state of the screen S, the emulsion D is applied onto the screen material M by the mechanisms 40, 50A and 50B through sequential steps including a first step for applying the emulsion D onto one side of the screen S, a second step for applying the emulsion D onto said one side while scraping off and recovering the emulsion D on the other side of the screen S and a third step for applying the emulsion repeatedly by urging the latter through the screen S from its ink-applying side to its printing side.

The mechanism 40 has a function to vertically move the applying and the scraping squeegees 35A, 35B of a bucket type along the screen face and practically comprises supporting bars 55A, 55B for releasably mounting the applying and the scraping squeegees 35A and 35B, units 45 arranged oppositely on the inner sides of the side walls 12, 13 for mounting the supporting bars 55A, 55B therebetween, chains 44 driven within the side walls 12, 13 and cooperated with the units 45, guides 42 arranged in the side walls 12, 13 and guide rollers 47 running along the guides 42. In other words, each guide 42 at its upper and lower parts is provided with sprocket wheels 43, the chain 44 over which is driven by the motor 41 accommodated in the lower part of the left wall 12, thereby to vertically move the units 45. Since the moving extent of the units 45 may be limited to a distance between the upper and the lower ends of the screen S secured to the supporting mechanism 20, the corresponding upper and lower positions on the side walls 12, 13 are provided with an upper and a lower limit switches 48 for discontinuing the motor 41 upon contact with the unit 45.

Figure 6:
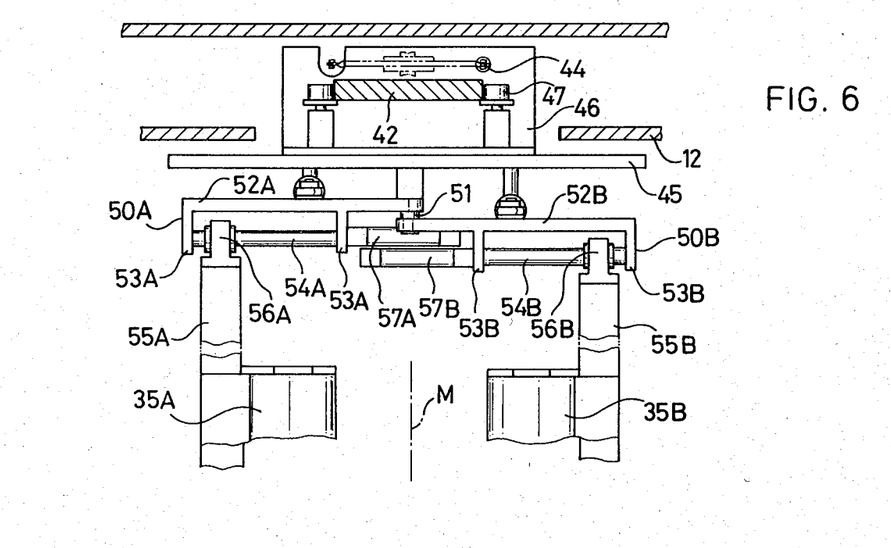
FIG. 6 is a plan view of a unit for the apparatus according to the invention.
Figure 7:
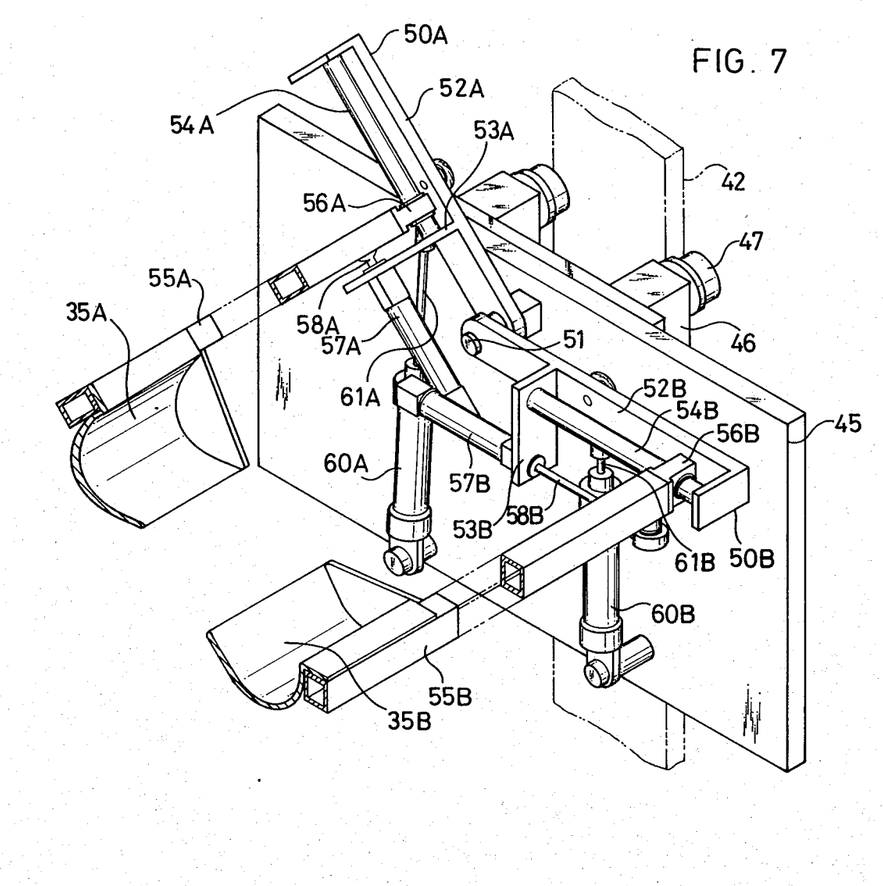
FIG. 7 is a perspective view of a working mechanism for the squeegee.

As shown in FIG. 6, the unit 45 and the chain 44 are associated by securing an engaging portion 46 protruded behind the unit 45 to the chain 44 behind the guide 42. Further, the engaging portion 46 supports the guide rollers 47 contacted with a leading and a trailing edge of the guide 42. These guide rollers 47 move along the guide 42 thereby to allow smooth vertical movement of the unit 45 in association with the driven chain 44 and to ensure a constant pressure of the squeegees 35A, 35B against the screen face and a constant distance therebetween. Further, a buffering material may be inserted between the guide 42 and the guide rollers 47 for absorbing shock and vibration during movement.

The squeegee operational mechanisms 50A, 50B allow the squeegee 35A to be moved toward the screen face M, for contacting its front edge therewith and to be inclined upon upward movement of the applying squeegee 35A, while they allow the squeegee 35B to be kept uncontacted with the screen face M, or to be moved toward the screen face M for contacting its front edge therewith but not to be inclined upon upward movement of the squeegee 35B. Further, upon downward movement of the squeegees 35A, 35B the mechanisms 50A, 50B allow both squeegees to be restored to their horizontal position and retreated apart from the screen face M. Thus, the squeegees 35A, 35B arranged on either side of the screen S may be operated individually. The squeegees 35A, 35B according to the invention may be operated simultaneously with one squeegee serving as the applying squeegee for applying the emulsion D onto one side of the screen, while the other squeegee serving for scraping and recovering the emulsion D from the other side of the screen. In this case, the applying screegee 35A (or 35B) is moved toward the screen and inclined, while the scraping squeegee 35B (or 35A) is also moved toward the screen but not inclined. Thus, such individual or independent movement of each squeegee 35A, 35B may eliminate requirement for setting or selecting the specific side of the screen upon setting by means of the supporting mechanism 20, thereby to improve the operability of the apparatus according to the invention. Further, either one of the squeegees 35A, 35B may be utilized as the applying or the scraping squeegee. For this purpose, the squeegee operational mechanisms 50A, 50B are arranged symmetrically and their individual movement may be controlled by a controlling mechanism 70, as described hereinafter.

The squeegee operational mechanisms 50A, 50B comprise, as shown in FIG. 6, a pair of units 45 vertically movable along the side walls 12, 13, a pair of inclining arms 52A, 52B swingably supported to the units, a pair of supporting bars 55A, 55B arranged between the arms 52A and 52B to be slidably guided along slide shafts 54A, 54B, cylinders 57A, 57B secured to the arms 52A, 52B and having pistons 58A, 58B connected to the supporting bars 55A, 55B, and cylinders 60A, 60B secured to the units 45 and having pistons 61A, 60B connected to the arms 52A, 52B. In this case, the cylinders 57A, 57B may be used for the horizontal reciprocating movement, while the cylinders 60A, 60B for the inclining movement.

Figure 5:
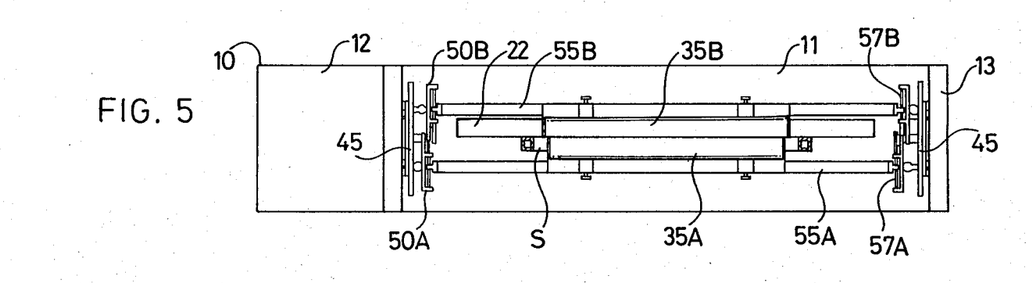
FIG. 5 is a cross-sectional view of the apparatus in FIG. 3.

As shown in FIGS. 5 and 6, when the squeegees 35A, 35B mounted to the supporting bars 55A, 55B apply the emulsion D, they advance toward the screen M to make their front edges contact therewith and then are inclined to pour the emulsion D (or the photosensitive liquid material) out of the squeegees onto the screen for penetration into its mesh. Thus, the squeegees 35A, 35B are desirably swung on their front edges in order to achieve inclination. In other words, in order to allow the squeegees 35A, 35B to horizontally advance toward or retreat from the screen face rapidly and smoothly, the supporting bars 55A, 55B are provided between the inclining arms 52A and 52B. The inclining movement of the arms 52A, 52B with time difference ensures the inclined attitude of the squeegees 35A, 35B for positioning their front edges on the same line as the supporting position of the arms 52A, 52B. For this purpose, the squeegee actuating mechanisms 50A and 50B, which actuate the squeegees 35A, 35B relative to the screen M supported by the supporting mechanism 20, are arranged symmetrically, while the supporting position of the arms 52A, 52B is located on a portion of the unit 45 which is situated on an extention from the screen material M, as best shown in FIG. 6.

In order to achieve the different levels of the applying squeegee 35A and the recovering squeegee 35B or the different supporting levels of the arms 52A and 52B, their arm ends are pivoted on the pin 51 for enabling the squeegees 35A, 35B to advance toward the screen but to take the different levels so as not to be brought into press contact with each other. Thus, in second step of the invention wherein both of the squeegees 35A, 35B are contacted with both sides of the screen while one of the squeegees serves to apply the emulsion D onto the screen and the other serves to scrape and recover the emulsion from the screen face, the urging force may be imparted upon upward movement to prevent the screen from being damaged and adequate tension may be imparted to ensure an excellent application of the emulsion D. Further, the screen face may be undulated due to the urging force by the squeegees, thereby to ensure the smooth application of the emulsion D onto the screen. In other words, even if the tension of the screen is not uniform upon initial arrangement, the undulation of the screen face due to the urging force by the squeegees may eliminate the ununiformity of the tension or may impart a constant tension to the screen. Thus, a constant thickness of applied film may be achieved irrespective of a degree of tension when the screen is initially arranged.

As shown in FIGS. 6 to 9, the arms 52A, 52B are provided with a pair of supports 53A, 53B, between which are horizontally arranged slide shafts 54A, 54B as well as cylinders 57A, 57B for horizontal movement which have their pistons 58A, 58B extended in parallel to the slide shaft 54A, 54B and connected at their front ends to joints 59A, 59B protruded from the supporting bars 55A, 55B. On the other hand, cylinders 60A, 60B for inclining movement are arranged vertically below the inclining arms 52A, 52B and secured to the unit base 45, pistons 61A, 61B of which at their front ends are connected to the arms 52A, 52B. The supporting bars 55A, 55B are provided at both ends with ball bushings 56A, 56B which are fitted to the slide shafts 54A, 54B. Due to arrangement of the ball bushings 56A, 56B the supporting bars 55A, 55B may move smoothly along the slide shafts 54A, 54B with low friction, thereby preventing the long supporting bars 55A, 55B from being deviated and thus stabilizing the movement.

Figure 8:
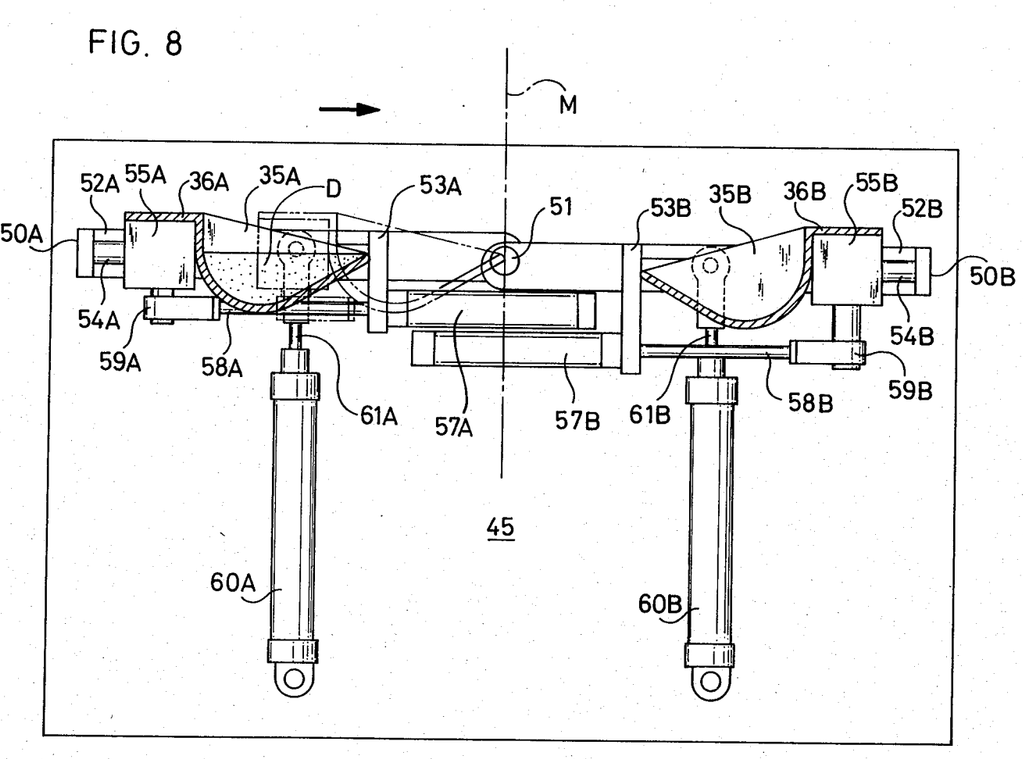
FIG. 8 is a side view of the mechanism of FIG. 7 before operation.
Figure 9:
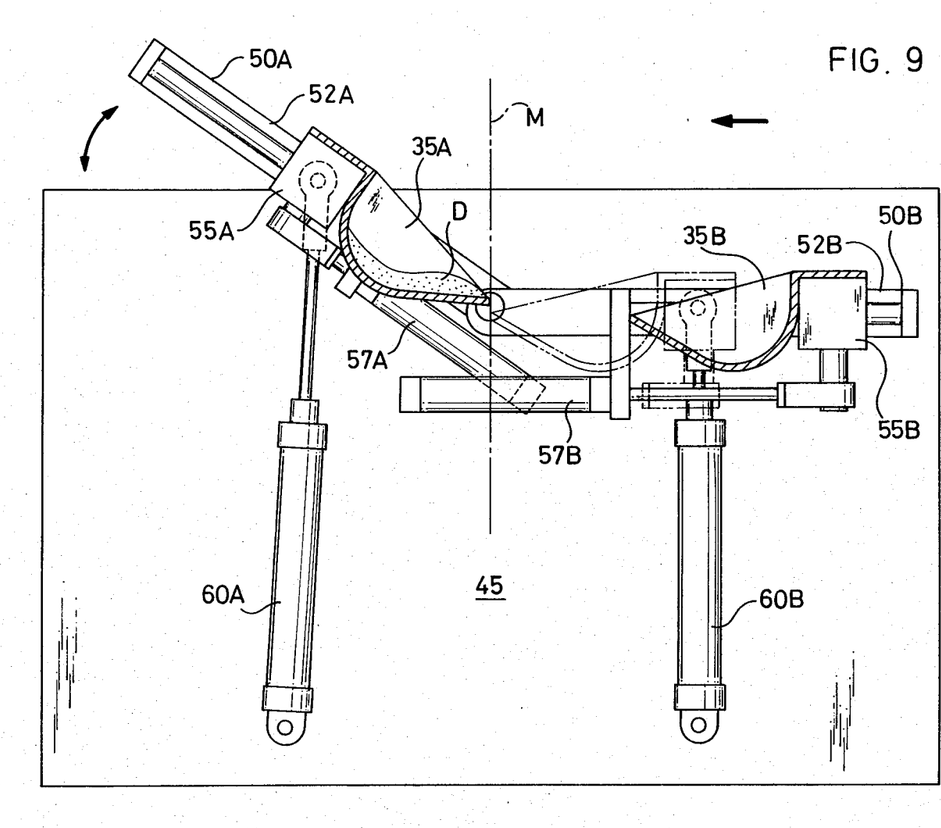
FIG. 9 is a side view of the mechanism of FIG. 7 during the second step.

Now referring to operation of the squeegee actuating mechanisms 50A, 50B, when the unit 45 is raised in accordance with the operation sequence which has been predetermined by a controlling mechanism 70 as described hereinafter, at least one of the cylinders 57A (57B) is operated to move forward the supporting bar 55A (55B) along the slide shaft 54A (54B) and thus the front edge of the applying squeegee 35A is contacted to the screen in the first and the third steps, while the front edge of the recovering squeegee 35B is contacted to the screen in the second step (FIG. 8). Then, in order to apply the emulsion D, the cylinder 60A (or 60B) is operated to swing and incline the arm 52A (or 52B) and hence the squeegee 35A (or 35B), thereby to pour the emulsion D out of the squeegee onto the screen face (FIG. 9). When the unit 45 is lowered, on the contrary, the cylinder 60A (or 60B) for the inclining movement is operated to restore the inclining arm 52A (or 52B) to its horizontal state and then the cylinder 57A (or 57B) for the horizontal movement is operated to retreat the supporting bar 55A (or 55B) and hence the squeegee 35A (35B) from the screen face. In this case, the cylinders 57A, 57B may be operated simultaneously, while the cylinder 60A or 60B should be operated singly.

The urging force of the squeegee 35A, 35B against the screen may be provided by the operation of the cylinder 57A, 57B and therefore may be readily adjusted by varying its air pressure. Further, the cylinder 57A, 57B is secured to the arm 52A, 52B and arranged horizontally, thereby to enable the urging force to be adjusted conveniently by the position adjustment through a forcible external force. Further, the inclining arm 52A, 52B is fixed to the unit 45 by the pin 51, so that the center for the inclining movement may be kept at the constant position, thereby to allow the smooth inclination of the squeegee 35A, 35B and to allow a pressure of applying the emulsion from the squeegee to be adjusted irrespective of the position of each inclined squeegee 35A, 35B.

As shown in FIGS. 8 and 9, the squeegee 35A, 35B is formed in a bucket type which has, in its cross-section, an inclined front wall, a central round bottom and a vertical rear wall. From an upper end of the rear wall is extended perpendicularly a removable base 36A, 36B which is placed on the supporting bar 55A, 55B of a square cross-section and fixed thereto by a suitable means 37 such as a screw. One of the squeegees 35A, 35B arranged on both sides of the screen may be shorter than the other, in order to achieve the different levels of the front edges of the squeegees. In general, the applying squeegee is longer, wider and smaller than the recovering squeegee. Of course, the squeegee at its front edge may be fabricated smoothly or may be provided with a suitable elastic material in order to prevent the contacted screen face from being damaged.

Figure 10:
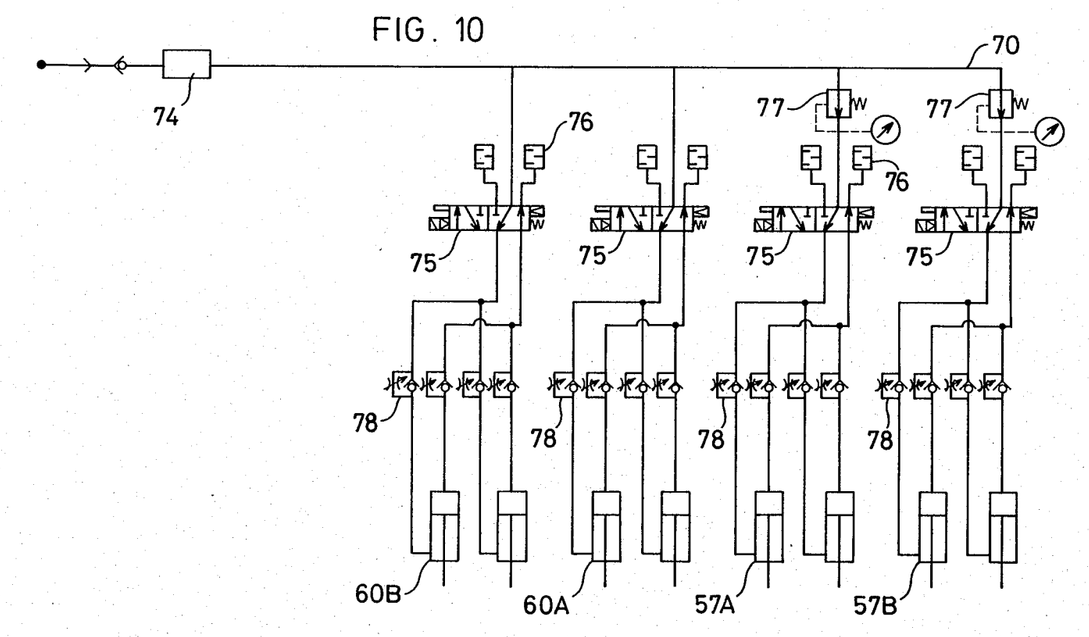
FIG. 10 shows a pneumatic circuit in a controlling mechanism.

Further, the apparatus according to the invention is provided with the controlling mechanism which comprises an electric, hydraulic or pneumatic circuit and controls the vertical movement of the squeegees 35A, 35B through the mechanism 40 as well as the horizontal and the inclining movement of the squeegees. In FIG. 10, four cylinders 57A, 57B for the horizontal movement and four cylinders 60A, 60B for the inclining movement in the squeegee actuating mechanism 50A, 50B may be supplied with an operating air or exhausted. These cylinders may be separately and independently operated by separate lines. An evacuating unit 74, a valve 75, a muffler 76, a reducing valve 77 and a speed controller 78 may be controlled, as shown in FIG. 3, by operating various buttons and/or knobs arranged on an electric operation panel 72 and a pneumatic operation panel 73 on the left wall 12. More particularly, application on either one side of the screen, sequential application on both sides of the screen, application on one side with recovery from the other side, determination of the applying number of times for obtaining a required thickness of applied film and a combination thereof may be automatically controlled.

Use of the apparatus according to the invention will be described hereinbelow with reference to FIG. 3. At first, the screen printing S is secured to the crank fixing bars 21, 22 of the supporting mechanism 20 by means of the clamp 23. On the other hand, the applying squeegee 35A mounted to the supporting bar 55A is filled with the emulsion D and the number of applications for the third step is set by various setting buttons on the operation panels 72, 73. When, the starting switch 71 is energized to start the operation. Thus, the cylinder 57A for the horizontal movement in the squeegee actuating mechanism 50A is operated to advance the supporting bar 55A and hence the squeegee 35A toward the screen face, thereby to allow its front edge to be contacted with the screen face. Then, the cylinder 60A for the inclining movement is operated to swing and incline the inclining arm 52A for lifting the rear end of the squeegee 35A, thereby pouring the emulsion D out of the squeegee 35A onto the screen. In this case, a variable timer may be provided for suitably setting a time for the emulsion D to become compatible to the screen. Then, the squeegee moving mechanism 40 is operated to move the unit 45 upward through the endless chain 44, thereby to lift the supporting bar 55A, and the squeegee 35A for applying the emulsion D from the squeegee 35A onto the screen. During this period the other squeegee 35B is not working and spaced apart from the screen face. If the squeegee 35A reaches the predetermined upper position for finishing the application of the emulsion D, then it discontinues its upward movement and thereafter the cylinder 60A is reoperated to restore the horizontal state of the squeegee 35A or, if necessary, it continues its upward movement in the horizontal state for scraping and recovering the emulsion D flooded out of the squeegee 35A, thereby to avoid non-uniformity of the applied film at the end portion. Then, the cylinder 57A is operated to retreat the squeegee 35A from the screen face, while the squeegee moving mechanism 40 is operated reversely to lower the squeegee 35A. Thus, the squeegee 35A may be lowered keeping its position spaced apart from the screen and may return to the starting point [FIG. 1 (1), the first step].

Now the recovering squeegee 35B moves forward by means of the cylinder 57B and comes into contact with the screen face without inclination, while the applying squeegee 35A is operated as described hereinabove. Then, the mechanism 40 enables the squeegee 35A to move upward for applying the emulsion D onto one side of the screen while the squeegee 35B moves upward for scraping and recovering the emulsion D from the other side of screen, thereby to ensure the uniform thickness of the applied film on the recovering side of the screen. The applying squeegee 35A may take a different vertical position from the recovering squeegee 35B but should move in front of the recovering squeegee 35B for obtaining the uniform thickness in the second step. Upon reaching the upper position, the applying squeegee 35A restores its horizontal state and retreats from the screen face, while the recovering squeegee 35B retreats from the screen face at first and then moves downward keeping its position spaced apart from the screen, thereby returning to the starting position [FIG. 1 (2), the second step].

In the second step, however, the squeegees 35A and 35B may be operated reversely. Namely, the squeegee 35A may serve as a recovering one, while the squeegee 35B may serve as an applying one. In this case, the emulsion may be applied on both sides of the screen and the applied screen face in the first step may be provided with a thin and uniform thickness, thereby to improve the uniformity of the applied film on the printing side of the screen, especially in the third step.

Figure 1:
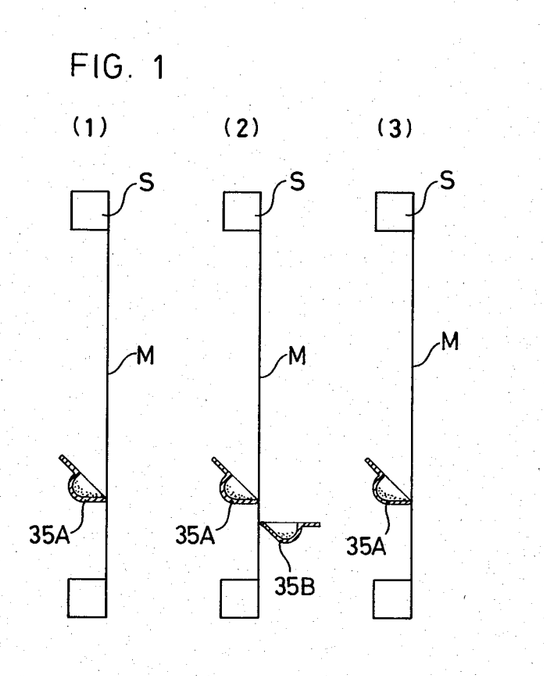
FIG. 1 is a schematic view illustrating a procedure of the method according to the invention.

Thereafter, in a similar way to the first step the emulsion D is applied suitable times onto the ink-applying side of the screen printing only by the squeegee 35A through the screen toward the printing side thereof in the third step [FIG. 1 (3)]. This operation may be carried out in such a way that the squeegee 35A is contacted to the screen face and inclined upon its upward movement and is retreated from the screen and restored to the horizontal state upon its downward movement after application of the emulsion D. Such operation may be repeated sufficient times, and the number of such repeated operations may be counted automatically. After the predetermined number of applications, the operation may be automatically discontinued.

Figure 2:
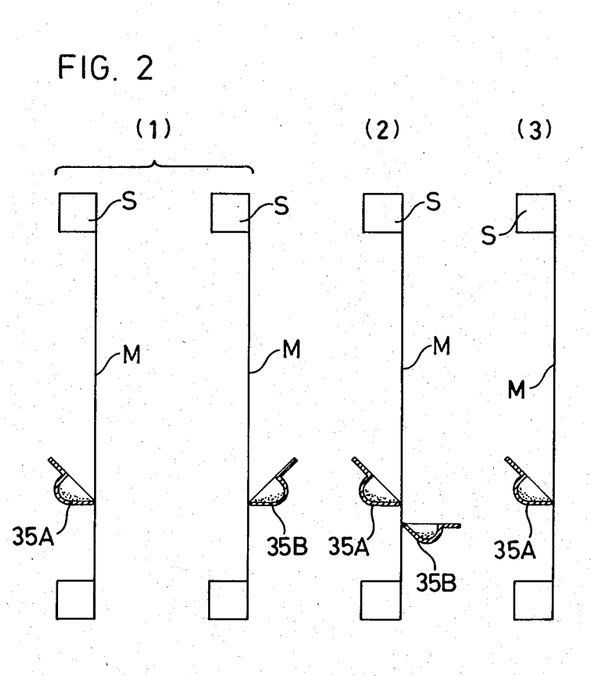
FIG. 2 is a similar schematic view illustrating another embodiment of the invention.

In FIG. 2, the emulsion D may be applied on both sides of the screen in the first step, in which case the application should be carried out on one side at first and subsequently on the other side of the screen [FIG. 2(1)]. For this purpose, the recovering squeegee 35B is also filled with the emulsion D. After the applying operation of the sequeegee 35A, only the recovering squeegee 35B is operated, similarly to the squeegee 35A, by the squeegee actuating mechanism 50B, the cylinder 57B for the horizontal movement, the cylinder 60B for the inclining movement 60B and the squeegee moving mechanism 40 for applying the emulsion D. The second and the third steps may be also carried out similarly to the operation as described with reference to FIG. 1 [FIGS. 2(2) and (3)]. Due to the sequential application of the emulsion D, the screen may become compatible on both sides with the applied emulsion. In the second step, the scraping operation of the squeegee 35B may be facilitated due to smooth sliding movement of its front edge on the screen face, thereby to prevent the damage of the screen.

In the illustrated embodiment, the applying squeegee 34A is directed to the ink-applying side of the screen printing, while the recovering squeegee 35B is directed to the printing side of the screen. This arrangement, however, may be reversed in which case the controlling mechanism 70 may be set to carry out the reverse operation.

In accordance with the invention, the squeegee 35A containing the emulsion D is moved toward the screen S secured by the supporting mechanism 20 and then contacted with the screen, inclined and moved upward for applying the emulsion D on the screen. In the first step, the emulsion D is applied on one side of the screen only from its lower portion, thereby to give an irregular face of the applied emulsion. In the second step, however, the emulsion becomes compatible with the whole area of the screen thereby to give a smooth and uniform face, while the recovering squeegee 35B scrapes the penetrated emulsion D on the printing side of the screen, thereby to produce a thin and uniform thickness of the applied film. As a result, the smooth and uniform surface of the applied screen printing may be achieved on its both sides. In the third step, the applied film on the printing side of the screen is successively increased in its thickness due to the repeated operation until the required thickness is achieved.

Thus, the invention may overcome the difficulty of the prior art in which the screen is applied on its both sides with the emulsion by two squeegees which move only vertically, so that the applied emulsion may flow down along the screen face especially upon the downward applying operation, depending on the viscosity of the emulsion, the temperature condition and other factors leading to an irregular face on the applied film. Further, in accordance with the invention, the applied film only on the printing side of the screen may be increased in its thickness which may be readily controlled by the number of the applying operations.

The squeegees 35A, 35B arranged on either side of the screen may be separately operated, so that either one of the squeegees 35A or 35B may selectively serve as the applying squeegee while the other remaining squeegee may serve to carry out the recovering operation. In addition, replacement of either one of the squeegees 35A, 35B may be conveniently carried out or avoided.

In accordance with the invention, the cylinders 57A, 57B for advancing or retreating the squeegees 35A, 35B and the cylinders 60A, 60B for inclining the latter are operated by separate pneumatic lines, so that the horizontal movement, the urging force against the screen face and the inclination angle of each squeegee may be separately controlled for achieving the optimum application of the emulsion.

Further, the controlling mechanism 70 enables each squeegee 35A or 35B to selectively carry out the applying or the recovering operation. Namely the application of the emulsion on one side while the recovery is effected on the other side of the screen, application on both sides of the screen, or a suitable number of the repeated applications and combinations thereof may be selectively embodied, thereby to facilitate automatic continuous operation.

In accordance with the invention, the emulsion may be applied only upon the upward movement of the squeegee for obtaining a uniform film on the screen. Further, the thickness of the applied film on the printing side of the screen may be conveniently controlled for obtaining a high quality of the screen printing.

What is claimed is:

1. An apparatus for applying an emulsion onto a screen printing plate, which comprises a base consisting of a frame having side walls at its opposite sides; a supporting mechanism having clamps for supporting the screen vertically; a lifting mechanism for lifting along the screen an applying squeegee and a scraping squeegee arranged on both sides of the screen; actuating mechanisms for the squeegees, one of said actuating mechanisms allowing the applying squeegee to move toward the screen, to be contacted at its leading edge with the screen and to be inclined upon its upward movement, while the other actuating mechanism allows the scraping squeegee to be not contacted with the screen, or to move toward the screen and to be contacted at its leading edge with the screen but not to be inclined upon its upward movement, both of said squeegees being restored to their horizontal state and retreated to be spaced apart from the screen face upon their downward movement; and a controlling mechanism for controlling the movement of each squeegee for allowing the applying squeegee to apply the emulsion and the scraping squeegee to scrape and recover the emulsion.

2. The apparatus according to claim 1, wherein the lifting mechanism for the squeegees comprises a supporting bar for removably mounting a squeegee thereon and units arranged oppositely for carrying the supporting bar therebetween, said units being coupled with chains each driven circulately within each side wall and each of said units being vertically guided along a side wall by guide rollers each arranged to move along a guide within a side wall.

3. The apparatus according to claim 1, wherein the lifting mechanism for the squeegees comprises a supporting bar for removably mounting a squeegee thereon and units arranged oppositely for carrying the supporting bar therebetween, said units being movable vertically along a side wall, and wherein the actuating mechanism for the squeegees comprises inclining arms each swingably supported on each unit movable vertically along a side wall; a supporting bar provided releasably with the applying and the scraping squeegees; slide shafts arranged on the inclining arms for slidably guiding the supporting bar between the inclining arms; said supporting bar being connected to a piston in a cylinder for horizontal movement fixed to the inclining arm, said inclining arm being connected to a piston of a cylinder support on the unit for inclining the arm.

4. The apparatus according to claim 1, wherein the applying and the scraping squeegees at their leading edges are different in vertical position along the screen.

5. The apparatus according to claim 1, wherein the controlling mechanism controls the movement and the inclination of the applying and the scraping squeegees separately from each other.

6. The apparatus according to claim 1, wherein the controlling mechanism controls the applying squeegee in such a way that the latter is advanced for contacting its leading edge with the screen face, lifted in its inclined state for applying the emulsion, returned to its horizontal state immediately before finishing the lifting movement, and then retreated and spaced apart from the screen face.

* * * * *